United States Patent
Uchida

(10) Patent No.: US 10,865,368 B2
(45) Date of Patent: Dec. 15, 2020

(54) RINSE AGENT COMPOSITION FOR SILICON WAFERS

(71) Applicant: KAO CORPORATION, Tokyo (JP)

(72) Inventor: Yohei Uchida, Wakayama (JP)

(73) Assignee: KAO CORPORATION, Tokyo (JP)

(*) Notice: Subject to any disclaimer, the term of this patent is extended or adjusted under 35 U.S.C. 154(b) by 15 days.

(21) Appl. No.: 16/471,849

(22) PCT Filed: Oct. 26, 2017

(86) PCT No.: PCT/JP2017/038763
§ 371 (c)(1),
(2) Date: Jun. 20, 2019

(87) PCT Pub. No.: WO2018/116631
PCT Pub. Date: Jun. 28, 2018

(65) Prior Publication Data
US 2019/0382697 A1    Dec. 19, 2019

(30) Foreign Application Priority Data
Dec. 22, 2016 (JP) .................. 2016-249679

(51) Int. Cl.
*C11D 3/04* (2006.01)
*C11D 11/00* (2006.01)
*C11D 3/37* (2006.01)
*C11D 7/32* (2006.01)
*C11D 17/08* (2006.01)

(52) U.S. Cl.
CPC ........ *C11D 11/0047* (2013.01); *C11D 3/3719* (2013.01); *C11D 7/3209* (2013.01); *C11D 17/08* (2013.01)

(58) Field of Classification Search
CPC ................................ C11D 11/0047
USPC ...................................... 510/175
See application file for complete search history.

(56) References Cited

U.S. PATENT DOCUMENTS

| | | | |
|---|---|---|---|
| 2004/0098924 A1 | 5/2004 | Iwasa | |
| 2006/0151854 A1 | 7/2006 | Kawase et al. | |
| 2013/0029268 A1* | 1/2013 | Koyama | B41C 1/1008 430/283.1 |
| 2013/0183826 A1 | 7/2013 | Tsuchiya et al. | |
| 2015/0267159 A1* | 9/2015 | Kishioka | C08F 230/08 435/180 |
| 2015/0299517 A1 | 10/2015 | Matsushita | |
| 2016/0281038 A1 | 9/2016 | Tamai et al. | |
| 2018/0361772 A1* | 12/2018 | Takanashi | G03F 7/105 |

FOREIGN PATENT DOCUMENTS

| | | |
|---|---|---|
| EP | 3062337 A1 | 8/2016 |
| JP | 2004-128089 A | 4/2004 |
| JP | 2009-141310 A | 6/2009 |
| JP | 2009-260236 A | 11/2009 |
| JP | 2010-538457 A | 12/2010 |
| JP | 2012-15353 A | 1/2012 |
| JP | 2013-515855 A | 5/2013 |
| JP | 2016-56220 A | 4/2016 |
| JP | 2016-194006 A | 11/2016 |
| WO | WO 2004/042812 A1 | 5/2004 |
| WO | WO 2007/146680 A1 | 12/2007 |
| WO | WO 2009/032065 A1 | 3/2009 |
| WO | WO 2009/073588 A1 | 6/2009 |
| WO | WO 2011/078982 A1 | 6/2011 |
| WO | WO 2012/039390 A1 | 3/2012 |
| WO | WO 2014/084091 A1 | 6/2014 |

(Continued)

OTHER PUBLICATIONS

International Search Report, issued in PCT/JP2017/038763, PCT/ISA/210, dated Dec. 19, 2017.

*Primary Examiner* — Gregory E Webb
(74) *Attorney, Agent, or Firm* — Birch, Stewart, Kolasch & Birch, LLP

(57) ABSTRACT

The rinsing composition for a silicon wafer of the present invention contains: a water-soluble polymer A containing a constitutional unit A having a betaine structure; and an aqueous medium. The water-soluble polymer A preferably contains a constitutional unit expressed by Formula (1) below. The water-soluble polymer preferably further contains a constitutional unit B expressed by Formula (2) below. The weight average molecular weight of the water-soluble polymer A is preferably 1,000 or more and preferably 3,000,000 or less. The rinsing composition for a silicon wafer of the present invention contains a pH regulator as needed.

[Chemical formula 1]

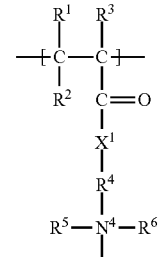

(1)

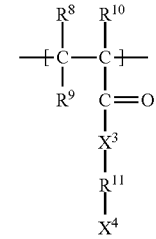

(2)

6 Claims, No Drawings

(56) References Cited

FOREIGN PATENT DOCUMENTS

| WO | WO 2015/060293 A1 | 4/2015 |
| WO | WO 2015/111684 A1 | 7/2015 |
| WO | WO 2016/035346 A1 | 3/2016 |

\* cited by examiner

RINSE AGENT COMPOSITION FOR SILICON WAFERS

TECHNICAL FIELD

The present invention relates to a rinsing composition for a silicon wafer, and a method for rinsing a silicon wafer and a method for producing a semiconductor substrate using the same.

BACKGROUND ART

Recently the design rule for semiconductor devices have become more minute due to the increasing demand for the trend of higher recording capacity of a semiconductor memory. As a result, in a photolithography carried out in the process of manufacturing the semiconductor device, the depth of focus is decreased, and the demand for the reduction in the surface defects (LPD: light point defects) and surface roughness (haze) of a silicon wafer (bare wafer) has become even further strict.

In order to improve the quality of a silicon wafer, a polishing step for polishing a silicon wafer includes a lapping (rough polishing) step, an etching step and a final polishing step. The lapping step includes planarizing a silicon wafer that has been obtained by slicing a silicon single crystal ingot into thin disks. The etching step includes etching the lapped silicon wafer, and, the final polishing step includes mirror-finishing the surfaces of the silicon wafer. Particularly, the final polishing step carried out in the final stage of the polishing aims to reduce the haze and to reduce the LPD such as particles, scratches and pits, which is achieved by improving wettability (hydrophilicity) of the polished silicon wafer surface.

As polishing liquid compositions for polishing a silicon wafer, Patent Document 1 discloses a polishing liquid composition for improving a haze level, containing silica particles, hydroxyethyl cellulose (HEC), polyethylene oxide, and an alkali compound. Patent Document 2 discloses a polishing liquid composition for a silicon wafer for reducing both of the haze and the LPD, containing a water-soluble polymer. In the water soluble polymer, a ratio of the number of oxygen atoms derived from hydroxyl groups to the number of oxygen atoms derived from polyoxyalkylene (the number of oxygen atoms derived from hydroxyl groups/the number of oxygen atoms derived from polyoxyalkylene) is within a predetermined range. Patent Document 3 discloses a polishing composition for a silicon wafer for reducing the contamination of the surfaces of a polished object while reducing the aggregation of abrasive grains. The polishing composition contains a polyvinyl alcohol resin having a 1,2-diol structure in its side chain and abrasive grains whose surfaces are chemically modified to have a minus zeta-potential on the surfaces in a solution having a pH of 2.0 or more and to have no isoelectric point. Patent Document 4 discloses a polishing liquid for CMP for increasing a barrier layer polishing rate while keeping the electric charge of abrasive grains positive, containing a compound having a betaine structure. Patent Document 5 discloses a composition for CMP for improving a copper polishing rate and flatness while reducing dishing, containing an amphoteric polymer. Patent Document 6 discloses a polishing agent for CMP for achieving a high oxide film polishing rate and reducing scratches, containing a specific compound having a betaine structure.

PRIOR ART DOCUMENTS

Patent Documents

Patent Document 1: JP 2004-128089 A
Patent Document 2: WO 20151060293
Patent Document 3: WO 2014/084091
Patent Document 4: JP 2012-015353 A
Patent Document 5: JP 2010-538457 A
Patent Document 6: JP 2009-260236 A

DISCLOSURE OF INVENTION

Problem to be Solved by the Invention

Under alkaline conditions, the surface charge of silica particles and the surface charge of a silicon wafer are both negative. Owing to charge repulsion, the silica particles cannot approach the silicon wafer, and the polishing rate cannot be fully exhibited. To cope with this, by adding a polishing aid such as a polymer to a polishing liquid composition, the polishing aid absorbs on both of the surfaces of the silicon wafer and the silica particles and reduces the charge repulsion between the silicon wafer and the silica particles. Thereby, a binder effect is exhibited and the polishing rate of the silicon wafer improves.

However, when the polishing aid is attached on the surfaces of the silicon wafer that has been polished in the polishing step (hereinafter, also referred to as a "polished silicon wafer"), the silica particles will reattach on the surfaces of the silicon wafer even if the polished silicon wafer is subjected to, e.g., water rinsing that includes: supplying water between the polished silicon wafer and a pad; and moving the pad relative to the polished silicon wafer while they are in contact with each other. This hinders the reduction of the LPD.

To cope with the above, the present invention provides a rinsing composition for a silicon wafer that can reduce the LPD, and a method for rinsing a silicon wafer and a method for producing a semiconductor substrate using the same.

Means for Solving Problem

A rinsing composition for a silicon wafer of the present invention is a rinsing composition for a silicon wafer that contains: a water-soluble polymer A containing a constitutional unit A having a betaine structure; and an aqueous medium.

A method for rinsing a silicon wafer of the present invention includes a step of rinsing a polished silicon wafer using the rinsing composition for a silicon wafer of the present invention.

A method for producing a semiconductor substrate of the present invention includes a step of rinsing a polished silicon wafer using the rinsing composition for a silicon wafer of the present invention.

Effects of the Invention

The present invention can provide a rinsing composition for a silicon wafer that can reduce the LPD, and a method for rinsing a silicon wafer and a method for producing a semiconductor substrate using the rinsing composition for a silicon wafer.

DESCRIPTION OF THE INVENTION

The present invention is based on the finding that a rinsing composition for a silicon wafer (hereinafter, also referred to as a "rinsing composition" simply) that contains a water-soluble polymer A containing a constitutional unit A having a betaine structure (hereinafter, also referred to as a "water-soluble polymer A" simply) can reduce the LPD of a polished silicon wafer.

In the present application, the betaine structure is a structure in which positive electric charge and negative electric charge are present in the same molecule, and electric charge is neutralized. The betaine structure has the positive electric charge and negative electric charge preferably at a position not adjacent to each other, and preferably at a position with one or more atoms interposed therebetween.

The mechanism of developing the effect of the present invention, that is, reducing the LPD of the polished silicon wafer when the rinsing composition of the present invention is used for a rinsing treatment of the polished silicon wafer, is assumed as below.

Under alkaline conditions, the surface charge of silica particles and the surface charge of the silicon wafer are both negative. On the other hand, the water-soluble polymer A contains the constitutional unit A having a betaine structure in which positive electric charge and negative electric charge are present in the same molecule. After the rinsing composition of the present invention is supplied to the polished silicon wafer, the water-soluble polymer A absorbing on the polished silicon wafer causes charge repulsion with the silica particles, and the water-soluble polymer A absorbing on the silica particles causes charge repulsion with the polished silicon wafer, and further a spatial repulsive force between the water-soluble polymer appears, thereby preventing the silica particles from reattaching on the surfaces of the polished silicon wafer. In this manner, the amount of the silica particles remaining on the polished silicon wafer to be washed can be reduced significantly, and the LPD of the polished silicon wafer can be reduced.

[Rinsing Composition]

The rinsing composition of the present invention contains the water-soluble polymer A, an aqueous medium, and an optional component within a range that does not impair the effect of the present invention. The details of the optional component will be described later,

[Water-Soluble Polymer A]

The water-soluble polymer A is a homopolymer or copolymer that contains a constitutional unit A having a betaine structure from the viewpoint of reducing the LPD. Here, "water-soluble" indicates having a solubility of 2 g/100 mL or more with respect to water (20° C.). The water-soluble polymer A preferably contains, as the constitutional unit A, a constitutional unit expressed by Formula (1) below from the viewpoint of reducing the LPD. The constitutional unit A is, e.g., a constitutional unit derived from an unsaturated monomer having a betaine structure.

(Constitutional Unit A)

A preferable example of the constitutional unit A contained in the water-soluble polymer A is a constitutional unit expressed by Formula (1) below from the viewpoint of reducing the LPD.

[Chemical formula 1]

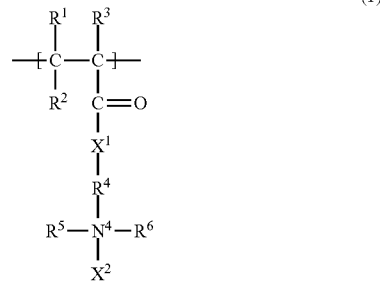

In Formula (1) above,
$R^1$ to $R^3$ are the same or different and represent a hydrogen atom, a methyl group or an ethyl group,
$R^4$ is an alkylene group with 1 to 4 carbon atoms or $-Y^1-OPO_3^--Y^2-$,
$Y^1$ and $Y^2$ are the same or different and represent an alkylene group with 1 to 4 carbon atoms,
$R^5$ and $R^6$ are the same or different and represent a hydrocarbon group with 1 to 4 carbon atoms,
$X^1$ is O or $NR^7$,
$R^7$ is a hydrogen atom or a hydrocarbon group with 1 to 4 carbon atoms,
$X^2$ is a hydrocarbon group with 1 to 4 carbon atoms, $-R^{17}SO_3^-$ or $-R^{18}COO^-$, and
$R^{17}$ and $R^{18}$ are the same or different and represent an alkylene group with 1 to 4 carbon atoms.

When $R^4$ is an alkylene group with 1 to 4 carbon atom, $X^2$ is $-R^{17}SO_3^-$ or $-R^{18}COO^-$. When $R^4$ is $-Y^1-OPO_3^--Y^2-$, $X^2$ is a hydrocarbon group with 1 to 4 carbon atoms.

$R^1$ and $R^2$ are both preferably a hydrogen atom from the viewpoint of availability of unsaturated monomer, polymerization property of monomer, and reduction of the LPD.

$R^3$ is preferably a hydrogen atom or a methyl group, and more preferably a methyl group from the viewpoint of availability of unsaturated monomer, polymerization property of monomer, and reduction of the LPD.

$X^1$ is preferably O (oxygen atom) from the viewpoint of availability of unsaturated monomer, polymerization property of monomer, and reduction of the LPD.

$R^4$ is preferably an alkylene group with 2 or 3 carbon atoms or $-Y^1-OPO_3^--Y^2-$, more preferably an alkylene group with 2 carbon atoms or $-Y^1-OPO_3^--Y^2-$, and further preferably $-Y^1-OPO_3^--Y^2-$ from the viewpoint of reducing the LPD, and $R^4$ is preferably an alkylene group with 2 carbon atoms from the viewpoint of availability of unsaturated monomer and polymerization property of monomer.

$Y^1$ and $Y^2$ are both preferably an alkylene group with 2 or 3 carbon atoms, and more preferably an alkylene group with 2 carbon atoms from the viewpoint of availability of unsaturated monomer, polymerization property of monomer, and reduction of the LPD.

$R^5$ and $R^6$ are both preferably a methyl group or an ethyl group, and more preferably a methyl group from the viewpoint of availability of unsaturated monomer, polymerization property of monomer, and reduction of the LPD.

When $R^4$ is an alkylene group with 1 to 4 carbon atoms, $X^2$ is $-R^{17}SO_3^-$ or $-R^{18}COO^-$, and preferably $-R^{18}COO-$ from the viewpoint of reducing the LPD. When $R^4$ is $-Y^1-OPO_3^--Y^2$, $X^2$ is a hydrocarbon group with 1 to 4 carbon atoms, and more preferably a methyl group from the viewpoint of reducing the LPD.

The number of carbon atoms of $R^{17}$ is preferably 1 to 3, and more preferably 2 to 3 from the viewpoint of availability of unsaturated monomer, polymerization property of monomer, and reduction of the LPD. The number of carbon atoms of $R^{18}$ is preferably 1 to 3, and more preferably 1 to 2 from the viewpoint of availability of unsaturated monomer, polymerization property of monomer, and reduction of the LPD.

The constitutional unit A is preferably a constitutional unit derived from at least one monomer selected from sulfobetaine methacrylate, methacryloyloxyethyl phosphorylcholine, and carboxybetaine methacrylate, more preferably a constitutional unit derived from at least one monomer selected from methacryloyloxyethyl phosphorylcholine and carboxybetaine methacrylate, and further preferably a constitutional unit derived from methacryloyloxyethyl phosphorylcholine from the viewpoint of reducing the LPD, and preferably a constitutional unit derived from at least one monomer selected from sulfobetaine methacrylate and carboxybetaine methacrylate from the viewpoint of availability of unsaturated monomer and polymerization property of monomer.

(Constitutional Unit B)

The water-soluble polymer A may contain a constitutional unit B that is at least one selected from a constitutional unit having a hydrophobic group, a constitutional unit having an anionic group, a constitutional unit having a cationic group and a constitutional unit having a nonionic group, and that is different from the constitutional unit A from the viewpoint of reducing the LPD. The constitutional unit B is preferably at least one selected from a constitutional unit having a hydrophobic group, a constitutional unit having a cationic group and a constitutional unit having a nonionic group from the viewpoint of improving adsorptivity to a wafer and reducing the LPD.

The constitutional unit B is preferably, e.g., a constitutional unit expressed by Formula (2) below from the viewpoint of reducing the LPD.

[Chemical formula 2]

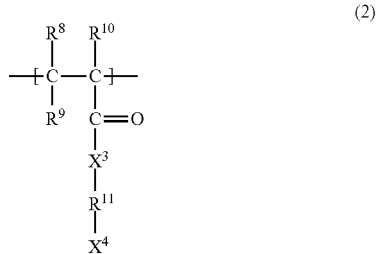

(2)

In Formula (2) above, $R^8$ to $R^{10}$ are the same or different and represent a hydrogen atom, a methyl group or an ethyl group, $X^3$ is O or $NR^{19}$, $R^{19}$ is a hydrogen atom or a hydrocarbon group with 1 to 4 carbon atoms, $R^{11}$ is an alkylene group with 1 to 22 carbon atoms (the hydrogen atom of the alkylene group may be substituted with a hydroxyl group) or $-(AO)_m-$ (where AO represents an alkyleneoxy group with 2 to 4 carbon atoms, and m represents an average number of added moles of 1 to 150), $X^4$ is a hydrogen atom, a hydrocarbon group with 1 to 4 carbon atoms (the hydrogen atom of the hydrocarbon group may be substituted with a hydroxyl group), a hydroxyl group, $N^+R^{12}R^{13}R^{14}$ or $NR^{15}R^{16}$, and $R^{12}$ to $R^{16}$ are the same or different and represent a hydrogen atom or a hydrocarbon group with 1 to 4 carbon atoms.

$R^8$ and $R^9$ are both preferably a hydrogen atom from the viewpoint of availability of unsaturated monomer, polymerization property of monomer, and reduction of the LPD.

$R^{10}$ is preferably a hydrogen atom or a methyl group, and more preferably a methyl group from the viewpoint of availability of unsaturated monomer, polymerization property of monomer, and reduction of the LPD.

$X^3$ is preferably O from the viewpoint of availability of unsaturated monomer, polymerization property of monomer, and reduction of the LPD.

When $X^4$ is a hydrogen atom, the number of carbon atoms of the alkylene group of $R^{11}$ is preferably 3 or more, more preferably 4 or more, and further preferably 6 or more, and preferably 18 or less, and more preferably 12 or less from the viewpoint of availability of unsaturated monomer, polymerization property of monomer, and reduction of the LPD, and m is preferably 2 to 30 from the same viewpoint.

When $X^4$ is a hydrocarbon group with 1 to 4 carbon atoms, $R^{11}$ is preferably $-(AO)_m-$, and the m is preferably 4 to 90 from the viewpoint of availability of unsaturated monomer, polymerization property of monomer, and reduction of the LPD.

AO is preferably composed of at least one alkyleneoxy group selected from an ethyleneoxy group (EO) (an alkyleneoxy group with 2 carbon atoms) and a propyleneoxy group (PO) (an alkyleneoxy group with 3 carbon atoms), and more preferably composed of EO from the viewpoint of availability of unsaturated monomer, polymerization property of monomer, and reduction of the LPD. When $-(AO)_m-$ contains two more kinds of alkyleneoxy groups having different number of carbon atoms, the sequences of the alkyleneoxy groups may be a block type or a random type, and preferably a block type.

When $X^4$ is a hydroxyl group, $N^+R^{12}R^{13}R^{14}$ or $NR^{15}R^{16}$, $R^{11}$ is preferably an alkylene group with 1 to 22 carbon atoms (the hydrogen atom of the hydrocarbon group may be substituted with a hydroxyl group) from the viewpoint of availability of unsaturated monomer, polymerization property of monomer, and reduction of the LPD, and the number of carbon atoms of the alkylene group is preferably 2 or more, preferably 3 or less, and more preferably 2 from the same viewpoint.

$X^4$ is preferably a hydrogen atom, a methyl group, a hydroxyl group or $N^+R^{12}R^{13}R^{14}$ from the viewpoint of availability of unsaturated monomer, polymerization property of monomer, and reduction of the LPD, and $R^{12}$ to $R^{14}$ are preferably a methyl group or an ethyl group, and more preferably a methyl group from the same viewpoint.

The constitutional unit B is preferably a constitutional unit derived from at least one monomer selected from an unsaturated monomer having a hydrophobic group (the hydrogen atom of the hydrophobic group may be substituted with a hydroxyl group) such as alkyl methacrylate, an unsaturated monomer having a cationic group such as methacrylate having a quaternary ammonium cation, and an unsaturated monomer having a nonionic group such as methacrylate having an ethyleneoxy group, more preferably a constitutional unit derived from at least one monomer selected from butylmethacrylate (BMA), 2-ethylhexyl methacrylate (EHMA), lauryl methacrylate (LMA), stearyl methacrylate (SMA), methacryloyloxyethyldimethyl ethylaminium (MOEDES), trimethyl[2-hydroxy-3-

(methacryloyloxy)propyl]aminium (THMPA), methacryloylethyl trimethylaminium (MOETMA), methoxypolyethylene glycol methacrylate (MPEGMA), polyethylene glycol methacrylate (PEGMA), methoxypolypropylene glycol methacrylate (MPPGMA), polypropylene glycol methacrylate (PPGM) and hydroxyethyl methacrylate (HEMA), further preferably a constitutional unit derived from at least one monomer selected from BMA, MOEDES, LMA, THMPA, MOETMA, MPEGMA, and HEMA, and still further preferably a constitutional unit derived from at least one monomer selected from LMA, THMPA, MOETMA, and MPEGMA from the viewpoint of availability of unsaturated monomer, polymerization property of monomer, and reduction of the LPD.

(Mole Ratio of the Constitutional Unit A to the Constitutional Unit B)

The mole ratio of the constitutional unit A to the constitutional unit B (the constitutional unit A/the constitutional unit B) in the water-soluble polymer A is preferably 10/90 or more, more preferably 20/80 or more, and further preferably 30/70 or more from the viewpoint of reducing the LPD, while the mole ratio is preferably 98/2 or less, and more preferably 95/5 or less from the same viewpoint.

(Constitutional Unit Other Than the Constitutional Unit A and the Constitutional Unit B)

The water-soluble polymer A may contain a constitutional unit other than the constitutional unit A and the constitutional unit B within a range that does not impair the effect of the present invention. The constitutional unit other than the constitutional unit A and the constitutional unit B is preferably a constitutional unit derived from a hydrophobic unsaturated monomer such as styrene.

The content of the constitutional unit other than the constitutional unit A and the constitutional unit B in the water-soluble polymer A is preferably 1 mass % or less, more preferably 0.5 mass % or less, further preferably 0.1 mass % or less, and still further preferably 0.05 mass % or less. The content of the constitutional unit other than the constitutional unit A and the constitutional unit B in the water-soluble polymer A may be 0 mass %.

The total content of the constitutional unit A and the constitutional unit B in the water-soluble polymer A is preferably 99 mass % or more, more preferably 99.5 mass % or more, further preferably 99.9 mass % or more, and yet further preferably 99.95 mass % or more, and it may be 100 mass %.

(Weight Average Molecular Weight of Watersoluble Polymer A)

The weight average molecular weight of the water-soluble polymer A is preferably 1,000 or more, more preferably 3,000 or more, further preferably 5,000 or more from the viewpoint of reducing the LPD, while the weight average molecular weight thereof is preferably 3,000,000 or less, more preferably 2,000,000 or less, and further preferably 1,000,000 or less from the same viewpoint. The weight average molecular weight of the water-soluble polymer A can be measured by the method described in Examples.

(Content of Water-Soluble Polymer A)

The content of the water-soluble polymer A in the rinsing composition is preferably 0.001 mass % or more, more preferably 0.015 mass % or more, further preferably 0.020 mass % or more, still further preferably 0.025 mass % or more, and yet further preferably 0.03 mass % or more from the viewpoint of reducing the LPD, while the content thereof is preferably 1.0 mass % or less, more preferably 0.7 mass % or less, further preferably 0.4 mass % or less, still further preferably 0.1 mass % or less, and yet further preferably 0.08 mass % or less from the same viewpoint.

[Aqueous Medium]

The aqueous medium contained in the rinsing composition of the present invention may be water such as ion exchanged water or ultrapure water, or a mixed medium of water and a solvent. The solvent is, e.g., polyhydric alcohol with 2 to 4 carbon atoms, and preferably glycerin or propylene glycol. The water in the aqueous medium is preferably ion exchanged water or ultrapure water, and more preferably ultrapure water. When the aqueous medium is a mixed medium of water and a solvent, the proportion of water with respect to the whole mixed medium is preferably 90 mass % or more, more preferably 92 mass % or more, and further preferably 95 mass % or more from the viewpoint of cost effectiveness.

The content of the aqueous medium in the rinsing composition of the present invention is preferably a remainder after subtracting the water-soluble polymer A and an optional component described below from the total amount of the rinsing composition.

[Optional Component (Aid)]

The rinsing composition of the present invention may further contain at least one optional component selected from a pH regulator, an antiseptic agent, alcohol, a chelating agent, an anionic surfactant, and a nonionic surfactant within a range that does not impair the effect of the present invention.

[pH Regulator]

Examples of the pH regulator include a basic compound, an acidic compound, and salts thereof. The salt of the acidic compound is preferably at least one selected from alkali metal salt, ammonium salt, and amine salt, and more preferably ammonium salt. The counter ion when the basic compound takes the form of salt is preferably at least one selected from hydroxide ion, chloride ion, and iodide ion, and more preferably at least one selected from hydroxide ion and chloride ion.

(Basic Compound)

Examples of the basic compound include sodium hydroxide, potassium hydroxide, ammonia, ammonium hydroxide, ammonium carbonate, ammonium hydrogencarbonate, methylamine, dimethylamine, trimethylamine, ethylamine, diethylamine, triethylamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(β-aminoethyl)ethanolamine, monoisopropanolamine, diisopropanolamine, triisopropanolamine, ethylenediamine, hexamethylenediamine, piperazine hexahydrate, anhydrous piperazine, 1-(2-aminoethyl)piperazine, N-methylpiperazine, diethylenetriamine, tetramethylammonium hydroxide, tetraethylammonium hydroxide, tetrapropylammonium hydroxide, and tetrabutylammonium hydroxide. The basic compound may be a combination of two or more kinds of these. The basic compound is more preferably ammonia from the viewpoint of reducing both of the haze and LPD of a silicon wafer, and improving the storage stability of the rinsing composition.

(Acidic Compound)

Examples of the acidic compound include: inorganic acids such as sulfuric acid, hydrochloric acid, nitric acid, and phosphoric acid; and organic acids such as acetic acid, oxalic acid, succinic acid, glycolic acid, malic acid, citric acid, and benzoic acid.

[Antiseptic Agent]

Examples of the antiseptic agent include phenoxyethanol, benzalkonium chloride, benzethonium chloride, 1,2-benzisothiazolin-3-one, (5-chloro-)2-methyl-4-isothiazoline-3-one, hydrogen peroxide, and hypochlorite.

[Alcohol]

Examples of the alcohol include methanol, ethanol, propanol, butanol, isopropyl alcohol, 2-methyl-2-propanal, ethylene glycol, propylene glycol, polyethylene glycol, and glycerin. The content of the alcohol in the rinsing composition of the present invention is preferably 0.01 mass % to 10 mass %.

[Chelating Agent]

Examples of the chelating agent include 1-hydroxyethane 1,1-diphosphonic acid, ethylenediamine tetraacetic acid, sodium ethylenediamine tetraacetate, nitrilotriacetic acid, sodium nitrilotriacetate, ammonium nitrilotriacetate, hydroxyethylethylenediamine triacetic acid, sodium hydroxyethylethylenediamine triacetate, triethylenetetramine hexaacetic acid, and sodium triethylenetetramine hexaacetate. The content of the chelating agent in the rinsing composition of the present invention is preferably 0.01 to 10 mass %.

[Anionic Surfactant]

Examples of the anionic surfactant include: carboxylates such as fatty acid soap and alkyl ether carboxylate; sulfonates such as alkyl benzene sulfonate and alkyl naphthalene sulfonate; sulfates such as fatty alcohol sulfate and alkyl ether sulfate; and phosphates such as alkyl phosphate.

[Nonionic Surfactant]

Examples of the nonionic surfactant include: polyethylene glycol types such as polyoxyethylene sorbitan fatty acid ester, polyoxyethylene sorbitol fatty acid ester, polyoxyethylene glycerine fatty acid ester, polyoxyethylene fatty acid ester, polyoxyethylene alkyl ether, polyoxyethylene alkyl phenyl ether, and polyoxyalkylene (hydrogenated) castor oil; polyhydric alcohol types such as sucrose fatty acid ester and alkyl glycoside; and fatty acid alkanolamide.

[Rinsing Composition]

The pH at 25° C. of the rinsing composition of the present invention is preferably 2 or more, more preferably 2.5 or more, further preferably 3 or more, and still further preferably 5 or more from the viewpoint of shortening the washing time, reducing the LPD, and improving the storage stability of the rinsing composition, while the pH thereof is preferably 12 or less, more preferably 11.5 or less, further preferably 11 or less, and still further preferably 10 or less from the same viewpoint. The pH can be adjusted by adding a pH regulator appropriately as needed. The pH at 25° C. can be measured using a pH meter ("HM-30G" manufactured by DKK-TOA CORPORATION) and is a value read on the pH meter one minute after dipping an electrode into the rinsing composition.

The content of each component described above is the content of each component in use. The rinsing composition of the present invention may be preserved and provided in the form of a concentrate as long as its storage stability is not impaired. This is preferred because the production and transportation costs can be reduced further. The concentrate may be diluted appropriately with the above aqueous medium as needed for use. The concentration rate is not particularly limited as long as the concentration after dilution is suitable for polishing, but preferably 2 times or more, more preferably 10 times or more, further preferably 20 times or more, and still further preferably 30 times or more from the viewpoint of reducing the production and transportation costs further.

When the rinsing composition of the present invention is the concentrate, the content of the water-soluble polymer A in the concentrate is preferably 0.02 mass % or more, more preferably 0.1 mass % or more, further preferably 0.5 mass % or more, still further preferably 1.0 mass % or more, and yet further preferably 1.5 mass % or more from the viewpoint of reducing the production and transportation costs, while the content thereof is preferably 20 mass % or less, more preferably 15 mass % or less, further preferably 10 mass % or less, and still further preferably 7.0 mass % or less from the viewpoint of improving the storage stability.

When the rinsing composition of the present invention is the concentrate, the pH of the concentrate at 25° C. is preferably 1.5 or more, more preferably 1.7 or more, and further preferably 2.0 or more, and preferably 12.5 or less, more preferably 12.0 or less, and further preferably 11.5 or less.

[Production Method of Rinsing Composition]

The rinsing composition of the present invention can be produced, for example, by a production method that includes a step of blending the water-soluble polymer A, the aqueous medium, and as needed the optional component by a known method. In the present disclosure, the "blending" includes mixing the water-soluble polymer A and as needed the optional component with the aqueous medium simultaneously or sequentially. The order of mixing the components is not particularly limited.

The blending can be carried out using a mixer such as a homomixer, a homogenizer, an ultrasonic disperser, or a wet ball mill. The blending amount of each component in the production method of the rinsing composition of this embodiment can be the same as the content of each component in the rinsing composition described above.

[Production Method of Semiconductor Substrate]

The rinsing composition of the present invention removes residues remaining on the surfaces of a silicon wafer that has been polished using a polishing liquid composition containing abrasive grains and a watersoluble polymer. An exemplary production method of a semiconductor substrate of the present invention includes: a polishing step of polishing a silicon wafer to be polished (hereinafter, also referred to as a "substrate to be polished") using a polishing liquid composition containing abrasive grains; a rinsing step of subjecting the polished silicon wafer to a rinsing treatment using the rinsing composition of the present invention; and a washing step of washing the silicon wafer that has been rinsed in the rinsing step (hereinafter, also referred to as a "rinsed silicon wafer").

The polishing step includes a lapping (rough polishing) step and a final polishing step. The lapping step includes planarizing the silicon wafer that has been obtained by slicing a silicon single crystal ingot into thin disks. The final polishing step includes etching the lapped silicon wafer and mirror-finishing the surfaces of the silicon wafer.

In the polishing step, for example, the polishing liquid composition is supplied between a silicon wafer to be polished and a pad, and then the pad is moved relative to the silicon wafer while they are in contact with each other. The polishing conditions such as the number of revolutions of the pad, the number of revolutions of the substrate to be polished, the polishing load of a polishing device equipped with the pad, the supply rate of the polishing liquid composition, and polishing time can be the same as those known conventionally.

It is preferred that the polishing liquid composition used in the polishing step contains, e.g., silica particles as abrasive grains and a water-soluble polymer from the viewpoint of improving the polishing rate and reducing the haze of a silicon wafer. The water-soluble polymer is preferably polysaccharide, acrylamide-based polymer, and polyvinyl alcohol (PVA). The polysaccharide is preferably hydroxyethyl cellulose (HEC). The acrylamide-based polymer is preferably poly(hydroxy)alkyl acrylamide, and more preferably polyhydroxyethyl acrylamide.

In the rinsing step, for example, the rinsing composition is supplied between a polished silicon wafer and a pad, and then the pad is moved relative to the polished silicon wafer while they are in contact with each other. The rinsing treatment in the rinsing step can be carried out using the polishing device used in the polishing step. The conditions such as the number of revolutions of the pad, the number of revolutions of the polished silicon wafer, the load of the polishing device equipped with the pad, and the supply rate of the rinsing composition may be the same as or different from the corresponding conditions in the polishing step. The rinsing time is preferably 1 second or more, and more preferably 3 seconds or more from the viewpoint of preventing the attachment of abrasive grains, while the rinsing time is preferably 60 seconds or less, and more preferably 30 seconds or less from the viewpoint of improving the productivity. The rinsing time refers to a time during which the rinsing composition is supplied.

The rinsing step may include a water rinsing treatment using water as a rinsing agent, prior to the rinsing treatment using the rinsing composition of the present invention.

The pad used in the rinsing step may be the same as that used in the polishing step, and may be any type such as a nonwoven fabric type or a suede type. The pad used in the polishing step may be used directly in the rinsing step without replacement. In this case, the pad may contain a certain amount of abrasive grains of the polishing liquid composition. The rinsing step can be carried out with respect to the silicon wafer that is still attached on the polishing device immediately after the polishing step.

The temperature of the rinsing composition used in the rinsing step is preferably 5 to 60° C.

It is appropriate that the rinsing step is carried out at least after the final polishing step, but it may be carried out after each of the rough polishing step and the final polishing step.

In the washing step, for example, the rinsed silicon wafer is soaked in a washing agent, or a washing agent is ejected onto the surface of the rinsed silicon wafer to be washed. Any conventionally known washing agent such as an aqueous solution containing ozone or an aqueous solution containing ammonium hydrogen fluoride may be used. The washing time may be set according to the washing method.

[Rinsing Method]

A method for rinsing a silicon wafer of the present invention (hereinafter, also referred to as a "rinsing method of the present invention") includes a rinsing step of subjecting a polished silicon wafer to a rinsing treatment using the rinsing composition of the present invention. The rinsing step in the rinsing method of the present invention can be carried out in the same manner as the rinsing step in the production method of a semiconductor substrate of the present invention. In the rinsing method of the present invention, since the rinsing composition of the present invention is used in the rinsing step, the amount of abrasive grains remaining on the polished silicon wafer can be reduced significantly, thereby reducing the LPD.

The present invention further relates to the following compositions and production methods.

[1] A rinsing composition for a silicon wafer, containing: a water-soluble polymer A containing a constitutional unit A having a betaine structure; and an aqueous medium.

[2] The rinsing composition for a silicon wafer according to [1], wherein the water-soluble polymer A preferably contains a constitutional unit having a betaine structure expressed by Formula (1) below:

[Chemical formula 3]

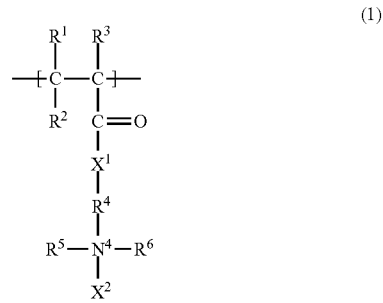

where
$R^1$ to $R^3$ are the same or different and represent a hydrogen atom, a methyl group or an ethyl group,
$R^4$ is an alkylene group with 1 to 4 carbon atoms or
$Y^1$ and $Y^2$ are the same or different and represent an alkylene group with 1 to 4 carbon atoms,
$R^5$ and $R^6$ are the same or different and represent a hydrocarbon group with 1 to 4 carbon atoms,
$X^1$ is O or $NR^7$,
$R^7$ is a hydrogen atom or a hydrocarbon group with 1 to 4 carbon atoms,
$X^2$ is a hydrocarbon group with 1 to 4 carbon atoms, $-R^{17}SO_3^-$ or $-R^{18}COO^-$,
$R^{17}$ and $R^{18}$ are the same or different and represent an alkylene group with 1 to 4 carbon atoms, and
when $R^4$ is an alkylene group with 1 to 4 carbon atom, $X^2$ is $-R^{17}SO_3^-$ or $-R^{18}COO^-$, and when $R^4$ is $-Y^1-OPO_3^--Y^2-$, $X^2$ is a hydrocarbon group with 1 to 4 carbon atoms.

[3] The rinsing composition for a silicon wafer according to [2], wherein $R^1$ and $R^2$ are preferably a hydrogen atom.

[4] The rinsing composition for a silicon wafer according to [2] or [3] wherein $R^3$ is preferably a hydrogen atom or a methyl group, and more preferably a methyl group.

[5] The rinsing composition for a silicon wafer according to any of [2] to [4], wherein $X^1$ is preferably O.

[6] The rinsing composition for a silicon wafer according to any of [2] to [5], wherein $R^4$ is preferably an alkylene group with 2 or 3 carbon atoms or $-Y^1-OPO_3^--Y^2-$, more preferably an alkylene group with 2 carbon atoms or $-Y^1-OPO_3^--Y^2-$, and further preferably $-Y^1-OPO_3^--Y^2-$.

[7] The rinsing composition for a silicon wafer according to any of [2] to [6], wherein $Y^1$ and $Y^2$ are preferably an alkylene group with 2 or 3 carbon atoms, and more preferably an alkylene group with 2 carbon atoms.

[8] The rinsing composition for a silicon wafer according to any of [2] to [5], wherein $R^4$ is preferably an alkylene group with 2 carbon atoms.

[9] The rinsing composition for a silicon wafer according to any of [2] to [8], wherein $R^5$ and $R^6$ are both preferably a methyl group or an ethyl group, and more preferably a methyl group.

[10] The rinsing composition for a silicon wafer according to any of [2] to [9], wherein when $R^4$ is an alkylene group with 1 to 4 carbon atoms, $X^2$ is preferably —$R^{18}$COO$^-$, and when $R^4$ is —$Y^1$—OPO$_3^-$—$Y^2$—, $X^2$ is preferably a methyl group.

[11] The rinsing composition for a silicon wafer according to any of [2] to [10], wherein the number of carbon atoms of $R^{17}$ is preferably 1 to 3, and more preferably 2 to 3.

[12] The rinsing composition for a silicon wafer according to any of [2] to [11], wherein the number of carbon atoms of $R^{18}$ is preferably 1 to 3, and more preferably 1 to 2.

[13] The rinsing composition for a silicon wafer according to any of [1] to [12], wherein the constitutional unit A having a betaine structure is preferably a constitutional unit derived from at least one monomer selected from sulfobetaine methacrylate, methacryloyloxyethyl phosphorylcholine, and carboxybetaine methacrylate, more preferably a constitutional unit derived from at least one monomer selected from methacryloyloxyethyl phosphorylcholine and carboxybetaine methacrylate, and further preferably a constitutional unit derived from methacryloyloxyethyl phosphorylcholine.

[14] The rinsing composition for a silicon wafer according to any of [1] to [12], wherein the constitutional unit A having a betaine structure is preferably a constitutional unit derived from at least one monomer selected from sulfobetaine methacrylate and carboxybetaine methacrylate.

[15] The rinsing composition for a silicon wafer according to any of [1] to [14], wherein the water-soluble polymer A preferably contains, as a constitutional unit B, a constitutional unit that is at least one selected from a constitutional unit having a hydrophobic group, a constitutional unit having an anionic group, a constitutional unit having a cationic group and a constitutional unit having a nonionic group, and that is different from the constitutional unit A, and more preferably at least one selected from a constitutional unit having a hydrophobic group, a constitutional unit having a cationic group and a constitutional unit having a nonionic group.

[16] The rinsing composition for a silicon wafer according to any of [1] to [15], wherein the water-soluble polymer A further contains, as the constitutional unit B, preferably a constitutional unit expressed by Formula (2) below:

[Chemical formula 4]

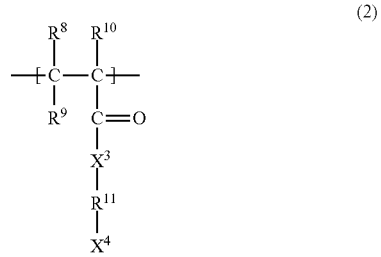

(2)

where
$R^8$ to $R^{10}$ are the same or different and represent a hydrogen atom, a methyl group or an ethyl group,
$X^3$ is O or NR$^{19}$,
$R^{19}$ is a hydrogen atom or a hydrocarbon group with 1 to 4 carbon atoms,
$R^{11}$ is an alkylene group with 1 to 22 carbon atoms (the hydrogen atom of the alkylene group may be substituted with a hydroxyl group) or -(A-O)$_m$— (where AO represents an alkyleneoxy group with 2 to 4 carbon atoms, and m represents an average number of added moles of 1 to 150),
$X^4$ is a hydrogen atom, a hydrocarbon group with 1 to 4 carbon atoms (the hydrogen atom of the hydrocarbon group may be substituted with a hydroxyl group), a hydroxyl group, N$^+$R$^{12}$R$^{13}$R$^{14}$ or NR$^{15}$R$^{16}$, and
$R^{12}$ to $R^{16}$ are the same or different and represent a hydrogen atom or a hydrocarbon group with 1 to 4 carbon atoms.

[17] The rinsing composition for a silicon wafer according to [16], wherein $R^8$ and $R^9$ are both preferably a hydrogen atom.

[18] The rinsing composition for a silicon wafer according to [16] or [17], wherein $R^{10}$ is preferably a hydrogen atom or a methyl group, and more preferably a methyl group.

[19] The rinsing composition for a silicon wafer according to any of [16] to [18], wherein $X^3$ is preferably O.

[20] The rinsing composition for a silicon wafer according to any of [16] to [19], wherein AO is preferably composed of at least one alkyleneoxy group selected from an ethyleneoxy group (EO) and a propyleneoxy group (PO), and more preferably composed of EO.

[21] The rinsing composition for a silicon wafer according to any of [16] to [20], wherein when $X^4$ is a hydrogen atom, the number of carbon atoms of the alkylene group of $R^{11}$ is preferably 3 or more, more preferably 4 or more, and further preferably 6 or more, and preferably 18 or less, and more preferably 12 or less.

[22] The rinsing composition for a silicon wafer according to any of [16] to [20], wherein in is preferably 2 to 30.

[23] The rinsing composition for a silicon wafer according to any of [16] to [22], wherein $X^4$ is preferably a hydrogen atom, a methyl group, a hydroxyl group or N$^+$R$^{12}$R$^{13}$R$^{14}$.

[24] The rinsing composition for a silicon wafer according to [23], wherein $R^{12}$ to $R^{14}$ are preferably a methyl group or an ethyl group, and more preferably a methyl group.

[25] The rinsing composition for a silicon wafer according to any of [16] to [24], wherein when $X^4$ is a hydrocarbon group with 1 to 4 carbon atoms, $R^{11}$ is preferably -(AO)$_m$—, and in is preferably 4 to 90.

[26] The rinsing composition for a silicon wafer according to any of [16] to [24], wherein when $X^4$ is a hydroxyl group, N$^+$R$^{12}$R$^{13}$R$^{14}$ or NR$^{15}$R$^{16}$, $R^{11}$ is preferably an alkylene group with 1 to 22 carbon atoms (the hydrogen atom of the hydrocarbon group may be substituted with a hydroxyl group), more preferably an alkylene group with 2 to 3 carbon atoms (the hydrogen atom of the hydrocarbon group may be substituted with a hydroxyl group), and further preferably an alkylene group with 2 carbon atoms (the hydrogen atom of the hydrocarbon group may be substituted with a hydroxyl group).

[27] The rinsing composition for a silicon wafer according to any of [16] to [26], wherein the constitutional unit B is preferably a constitutional unit derived from at least one monomer selected from an unsaturated monomer having a hydrophobic group (the hydrogen atom of the hydrophobic group may be substituted with a hydroxyl group) such as alkyl methacrylate, an unsaturated monomer having a cationic group such as methacrylate having a quaternary ammonium cation, and an unsaturated monomer having a nonionic group such as methacrylate having an ethyleneoxy group, more preferably a constitutional unit derived from at least one monomer selected from butylmethacrylate (BMA) 2-ethylhexyl methacrylate (EHMA), lauryl methacrylate (LMA), stearyl methacrylate (SMA), methacryloxyethyldimethyl ethylaminium (MOEDES), trimethyl[2-hydroxy-3-(methacryloyloxy)propyl]aminium (THMPA), methacryloylethyl trimethylaminium (MOETMA), methoxypolyethylene glycol methacrylate (MPEGMA), polyethylene glycol methacrylate (PEGMA), methoxypolypropylene glycol methacrylate (MPPGMA), polypropylene glycol methacrylate (PPGMA) and hydroxyethyl methacrylate (HEMA), further preferably a constitutional unit derived from at least one monomer selected from BMA, MOEDES, LMA, THMPA, MOETMA, MPEGMA, and HEMA, and still further preferably a constitutional unit derived from at least one monomer selected from LMA, THMPA, MOETMA, and MPEGMA.

[28] The rinsing composition for a silicon wafer according to any of [16] to [27], wherein the mole ratio of the constitutional unit A to the constitutional unit B (the constitutional unit A/the constitutional unit B) in the water-soluble polymer A is preferably 10/90 or more, more preferably 20/80 or more, and further preferably 30/70 or more, and preferably 98/2 or less, and more preferably 95/5 or less.

[29] The rinsing composition for a silicon wafer according to any of [1] to [28], wherein the weight average molecular weight of the water-soluble polymer A is preferably 1,000 or more, more preferably 3,000 or more, further preferably 5,000 or more, and preferably 3,000,000 or less, more preferably 2,000,000 or less, and further preferably 1,000,000 or less.

[30] The rinsing composition for a silicon wafer according to any of [1] to [29], wherein the content of the water-soluble polymer A in the rinsing composition for a silicon wafer is preferably 0.001 mass % or more, more preferably 0.015 mass % or more, further preferably 0.020 mass % or more, still further preferably 0.025 mass % or more, and yet further preferably 0.03 mass % or more, and preferably 1.0 mass % or less, more preferably 0.7 mass % or less, further preferably 0.4 mass % or less, still further preferably 0.1 mass % or less, and yet further preferably 0.08 mass % or less.

[31] The rinsing composition for a silicon wafer according to any of [1] to [30], wherein the pH at 25° C. of the rinsing composition for a silicon wafer is preferably 2 or more, more preferably 2.5 or more, further preferably 3 or more, and still further preferably 5 or more, and preferably 12 or less, more preferably 11.5 or less, further preferably 11 or less, and still further preferably 10 or less.

[32] A method for rinsing a silicon wafer, including a step of rinsing a polished silicon wafer using the rinsing composition for a silicon wafer according to any of [1] to [31].

[33] A method for producing a semiconductor substrate, including a step of rinsing a polished silicon wafer using the rinsing composition for a silicon wafer according to any of [1] to [31].

[34] A method for producing a semiconductor substrate, including:
a polishing step of polishing a silicon wafer to be polished using a polishing liquid composition that contains abrasive grains and a watersoluble polymer;
a rinsing step of rinsing the polished silicon wafer using the rinsing composition for a silicon wafer according to any of [1] to [31]; and
a washing step of washing the rinsed silicon wafer.

[35] The method for producing a semiconductor substrate according to [34], wherein the polishing step is preferably a rough polishing step of planarizing a silicon wafer that has been obtained by slicing a silicon single crystal ingot into thin disks, or a final polishing step of etching the lapped silicon wafer and mirror-finishing the surfaces of the silicon wafer, and more preferably the final polishing step.

[36] A use of the rinsing composition for a silicon wafer according to any of [1] to [31] for producing a semiconductor substrate made of silicon single crystal.

EXAMPLES

1. Measurement Method of Various Parameters
[Measurement 1 of Weight Average Molecular Weight of Water-Soluble Polymer]
The weight average molecular weights of the water-soluble polymers (other than A1, A2) used for preparation of the rinsing compositions were calculated based on the peak in chromatogram obtained by applying a gel permeation chromatography (GPC) method under the conditions below.
Instrument: HLC-8320 GPC (manufactured b TOSOH CORPORATION, detector integral type)
Column: two TSKgel (registered trademark) (manufactured by TOSHO CORPORATION) connected in series
Eluant: 0.15 mol $Na_2SO_4$/1% $CH_3COOH$/water
Flow rate: 1.0 mL/min
Column temperature: 40° C.
Detector: RI detector
Reference material: pullulan
[Measurement 2 of weight average molecular weight of water-soluble polymer]
The weight average molecular weights of the water-soluble polymers A1 and A2 were measured based on a SLS (static light scattering) method. Each
weight average molecular weight (Mw) was calculated by measuring static light scattering using a light scattering spectrophotometer "DLS-7000" (manufactured by OTSUKA ELECTRONICS Co., LTD.) under the conditions below to create a Zimm plot. A refractive index increment, which is necessary to calculate a molecular weight, was measured using a differential refractometer "DRM3000" (manufactured by OTSUKA ELECTRONICS Co., LTD.).
Wavelength: 632.8 nm (helium-neon laser)
Scattering angle: measured every 10° from 30° to 150°
Average temperature: 25° C.
Solvent: trifluoroethanol
2. Preparation of Rinsing Compositions
Rinsing compositions (all concentrates) of Examples and Comparative Examples were prepared by stirring and mixing the water-soluble polymer A or a comparison object and ion exchanged water, and adjusting the pH at 25° C. to 7.0 using a hydrochloric acid aqueous solution or 28 mass % ammonia water (special grade reagent manufactured by Kishida Chemical Co., Ltd.) as needed. The exceptions were that the pH was adjusted to 4.0 in Example 13, the pH was adjusted to 10.0 in Example 14, and the concentration of ammonia was set to 5 ppm in Comparative Example 5. A remainder after subtracting the water-soluble polymer A or comparison object and hydrochloric acid or ammonia was ion exchanged water. Incidentally, the contents of the respective components in Table 2 are values of the rinsing compositions obtained by diluting the concentrates by 20 times.

The following are the details of the water-soluble polymers A used for preparation of the rinsing compositions of Examples 1-17. In Table 1 and the following description, the constitutional unit A and the constitutional unit B of the water-soluble polymers A are indicated as constitutional units derived from the following compounds for the sake of simplicity.

SBMA: N,N-Dimethyl-N-(3-sulfonatopropyl)-2-(methacryloyloxy)ethane-1-aminium
MOEDES Methacryloyloxyethyldimethyl ethylaminitun
BMA: Butylmethacrylate
MPC: 2-Methacryloyloxyethyl phosphorylcholine
LMA: Lauryl methacrylate
THMPA: Trimethyl[2-hydroxy-3-(methacryloyloxy)propyl]aminium
CBMA: Methacryloylethyl betaine
MOETMA: Methacryloylethyl trimethylaminium
MPEGMA: Methoxypolyethylene glycol methacrylate
HEMA: Hydroxyethyl methacrylate Table 1 below indicates the details of the constitutional units derived from the above compounds.

TABLE 1

| Constitutional unit | Structure in Formula (1) | Structure in Formula (2) |
|---|---|---|
| SBMA | $R^1 = R^2 = H$, $R^3 = CH_3$, $R^4 = C_2H_4$, $R^5 = R^6 = CH^3$, $X^1 = O$, $X^2 = -R^{17}SO_3^-$, $R^{17} = C_3H_6$ | — |
| BMA | — | $R^8 = R^9 = H$, $R^{10} = CH_3$, $X^3 = O$, $R^{11} = C_4H_8$, $X^4 = H$ |
| MOEDES | — | $R^8 = R^9 = H$, $R^{10} = CH_3$, $X^3 = O$, $R^{11} = C_2H_4$, $X^4 = N^+R^{12}R^{13}R^{14}$, $R^{12} = R^{13} = CH_3$, $R^{14} = C_2H_5$, |
| MPC | $R^1 = R^2 = H$, $R^3 = CH_3$, $R^4 = -Y^1-OPO_3-Y^2-$, $Y^1 = Y^2 = C_2H_4$, $R^5 = R^6 = CH_3$, $X^1 = O$, $X^2 = CH_3$ | — |
| LMA | — | $R^8 = R^9 = H$, $R^{10} = CH_3$, $X^3 = O$, $R^{11} = C_{12}H_{24}$, $X^4 = H$ |
| THMPA | — | $R^8 = R^9 = H$, $R^{10} = CH_3$, $X_3 = O$, $R^{11} = CH_2CH(OH)CH_2$, $X^4 = N^+R^{12}R^{13}R^{14}$, $R^{12} = R^{13} = R^{14} = CH_3$ |
| CBMA | $R^1 = R^2 = H$, $R^3 = CH_3$, $R^4 = C_2H_4$, $R^5 = R^6 = CH_3$, $X^1 = O$, $X^2 = -R^{18}COO^-$, $R^{18} = CH_2$ | — |
| MOETMA | — | $R^8 = R^9 = H$, $R^{10} = CH_3$, $X^3 = O$, $R^{11} = C_2H_4$, $X^4 = N^+R^{12}R^{13}R^{14}$, $R^{12} = R^{13} = R^{14} = CH_3$ |
| MPEGMA | — | $R^8 = R^9 = H$, $R^{10} = CH_3$, $X^3 = O$, $R^{11} = -(EO)_m-$, $X^4 = CH_3$ |
| HEMA | — | $R^8 = R^9 = H$, $R^{10} = CH_3$, $X^3 = O$, $R^{11} = C_2H_4$, $X^4 = OH$ |

[Production of Water-Soluble Polymer A1]
(Step 1)
53.23 g of ethanol was placed in a four-neck flask (capacity: 500 mL and heated to 78° C. for reflux. A solution prepared by mixing 150.00 g of 2-(dimethylamino)ethyl methacrylate and 16.60 g of ethanol, and a solution prepared by mixing 0.92 g of 2,2'-azobis(2-methylbutyronitrile) and 10.00 g of ethanol were separately dropped into the flask for two hours for polymerization. After four hours of aging, the resultant was cooled to obtain a polymer solution.

(Step 2)
75.76 g of the obtained polymer solution, 3.47 g of sodium hydrogencarbonate and 150.00 g of water were placed in a four-neck flask (capacity: 1000 mL) and heated to 50° C. 42.73 g of 1,3-propanesultone was dropped into the flask for one hour for reaction. After three hours of aging, the ethanol was distilled off by heating under reduced pressure for two hours at 90° C./20 kPa, whereby a polymer aqueous solution containing a water-soluble polymer A1 (SBMA polymer) was obtained. The weight average molecular weight of the water-soluble polymer A1 was 40,000.

[Production of Water-Soluble Polymer A2]
(Step 1)
A stirrer chip, 2.00 g of BMA (manufactured by FUJIFILM Wako Pure Chemical Corporation), 19.90 g of 2-(dimethylamino)ethyl methacrylate, 0.14 g of 2,2'-azobis(2-methylbutyronitrile) and 21.90 g of methyl ethyl ketone (manufactured by FUJIFILM Wake Pure Chemical Corporation) were placed in a recovery flask and subjected to nitrogen bubbling for 30 minutes. Then, the obtained solution was reacted for eight hours at 67° C., ice-cooled while being exposed to the air, and dried to obtain a polymer solid.

(Step 2)
6.00 g of the obtained polymer solid, 24.00 g of 2,2,2-trifluoroethanol (manufactured by Merck KGaA, Darmstadt (Sigma-Aldrich)) and 4.71 g of 1,3-propanesultone were placed in a recovery flask to dissolve the polymer. The solution was reacted for five hours at 50° C. and dried to obtain a water-soluble polymer A2 (a random copolymer of SBMA and BMA, solid). The mole ratio (SBMA/BMA) of the constitutional units in the water-soluble polymer A2 was 90/10, and the weight average molecular weight of the water-soluble polymer A2 was 140,000.

[Production of Water-Soluble Polymer A3]
(Step 1)
126.30 g of ethanol (manufactured by FUJIFILM Wako Pure Chemical Corporation) was placed in a four-neck flask (capacity: 1000 mL) and heated to 78° C. for reflux. A solution prepared by miidng 181.12 g of 2-(dimethylamino) ethyl methacrylate (manufactured by FUJIFILM Wako Pure Chemical Corporation), 23.60 g of 2-(dimethylamino)ethyl methacrylate diethyl sulfate (manufactured by Kao Corporation, 90% aqueous solution) and 53.20 g of ethanol, and a solution prepared by mixing 5.83 g of 2,2'-azobis(2-methylbutyronitrile) (manufactured by FUJIFILM Wako Pure Chemical Corporation) and 10.00 g of ethanol were separately dropped into the flask for two hours. After four hours of aging, the resultant was cooled to obtain a polymer solution.

(Step 2)

94.70 g of the obtained polymer solution, 3.15 g of sodium hydrogencarbonate (manufactured by FUJIFILM Wako Pure Chemical Corporation) and 150.00 g of water were placed in a four-neck flask (capacity: 1000 mL) and heated to 50° C. 38.70 g of 1,3-propanesultone (manufactured by Tokyo Chemical Industry Co., Ltd.) was dropped into the flask for one hour for reaction. After three hours of aging, the ethanol was distilled off by heating under reduced pressure for two hours at 90° C./20 kPa, whereby an aqueous solution containing a water-soluble polymer A3 (a copolymer of SBMA and MOEDES) was obtained. The mole ratio (SBMA/MOEDES) of the constitutional units in the water-soluble polymer A3 was 95/5, and the weight average molecular weight of the water-soluble polymer A3 was 63,000.

[Water-Soluble Polymer A4]

A copolymer of MPC and BMA (trade name: LIPIDURE (registered trademark)-PMB manufactured by NOF CORPORATION) was used as a water-soluble polymer A4. The mole ratio (MPC/BMA) of the constitutional units in the water-soluble polymer A4 was 80/20, and the weight average molecular weight of the water-soluble polymer A4 was 600,000.

[Water-Soluble Polymer A5]

15.0 g of ethanol was placed in a four-neck flask (capacity: 300 mL) and heated to 70° C. A solution prepared by mixing 5.0 g of MPC (manufactured by Tokyo Chemical Industry Co., Ltd.), 2.4 g of BMA (manufactured by FUJIFILM Wako Pure Chemical Corporation) and 10.0 g of ethanol, and a solution prepared by mixing 0.035 g of 2,2'-azobis(isobutyronitrile) (manufactured by FUJIFILM Wako Pure Chemical Corporation) and 5.0 g of ethanol were separately dropped into the flask for two hours for polymerization. After six hours of aging, the solvent was distilled off under reduced pressure and replaced with water, whereby a polymer aqueous solution containing a copolymer A5 was obtained. The mole ratio (MPC/BMA) of the constitutional units in the water-soluble polymer A5 was 50/50, and the weight average molecular weight of the water-soluble polymer A5 was 120,000.

[Water-Soluble Polymer A6]

10.0 g of ethanol was placed in a four-neck flask (capacity: 300 mL) and heated to 70° C. A solution prepared by mixing 5.0 g of MPC (manufactured by Tokyo Chemical Industry Co., Ltd.), 1.1 g of LMA (manufactured by Wako Pure Chemical. Corporation) and 10.0 g of ethanol, and a solution prepared by mixing 0.021 g of 2,2'-azobis(isobutyronitrile) (manufactured by FUJIFILM Wake Pure Chemical Corporation) and 4.4 g of ethanol were separately dropped into the flask for two hours for polymerization. After six hours of aging, the solvent was distilled off under reduced pressure and replaced with water, whereby a polymer aqueous solution containing a water-soluble polymer A6 (a copolymer of MPC and LMA) was obtained. The mole ratio (MPC/LMA) of the constitutional units in the water-soluble polymer A6 was 80/20, and the weight average molecular weight of the water-soluble polymer A6 was 100,000.

[Water-Soluble Polymer A7]

A copolymer of MPC and THMPA (trade name: LIPIDURE (registered trademark)-C manufactured by NOF CORPORATION) was used as a water-soluble polymer A7.

[Water-Soluble Polymer A8]

A polymer of CBMA (trade name: PLAS SIZE L-402W manufactured by GOO CHEMICAL CO., LTD) was used as a water-soluble polymer A8.

[Water-Soluble Polymer A9]

A copolymer of CBMA and MOETMA and MPEGMA (trade name: PLAS SIZE L-440W manufactured by GOO CHEMICAL CO., LTD.) was used as a water-soluble polymer A9.

[Water-Soluble Polymer A10]

A copolymer of CBMA and MOETMA and HEMA (trade name: PLAS SIZE L-450W manufactured by GOO CHEMICAL CO., LTD.) was used as a water-soluble polymer A10.

The following are the details of the comparison objects of the water-soluble polymers A used for preparation of the rinsing compositions of Comparative Examples 1-8.

A51: Poly(N-isopropylacrylamide) (Mn 20,000~40,000): manufactured by MERCK KGAA, DARMSTADT (SIGMA-ALDRICH)

A52: SE-400 (HEC, Mw 250,000): manufactured by Daicel Corporation

A53: PVA-117 (Mw 75,000): manufactured by KURARAY CO., LTD.

A54: Polyethylene oxide) (Mw 200,000): manufactured by Polysciences, Inc.

A55: n-Decylpentaoxyethylene: manufactured by Bachem AG

A56: 2-(Trimethylammonio)acetate: manufactured by FUJIFILM Wako Pure Chemical Corporation A57: Poly(acrylamide/acrylic acid): manufactured by Polysciences, Inc.

A58: CBMA monomer: manufactured by OSAKA ORGANIC CHEMICAL INDUSTRY LTD.

3. Rinsing Method

Each rinsing composition (concentrate) was diluted by 20 times with ion-exchanged water. The rinsing composition diluted was filtered with a filter (compact cartridge filter "MCP-LX-C10S" manufactured by Advantech Co., Ltd.) immediately before the start of the rinsing treatment, and silicon wafers described below (silicon single-sided mirror wafer 200 mm in diameter (conduction type: P, crystal orientation: 100, resistivity: 0.1 Ω·cm or more and less than 100 Ω·cm)) were subjected to a rinsing treatment under the rinsing conditions below. In advance of the rinsing treatment, the silicon wafers were roughly polished using a commercially available polishing liquid composition. The silicon wafers that had been roughly polished and subjected to a final polishing had a surface roughness (haze) of 2.680 (ppm). The haze is a value at the dark field wide oblique incidence channel (DWO) measured using "Surfscan SP1-DLS" manufactured by KLA Corporation. The silicon wafers were then subjected to a final polishing under the conditions below and subjected to a rinsing treatment using the respective rinsing compositions directly after the final polishing, under the conditions below.

[Polishing Liquid Composition Used in Final Polishing]

The polishing liquid composition used in the final polishing was obtained in the following manner. SE-400 (manufactured by Daicel Corporation, HEC, molecular weight: 250,000), PEG 6000 (manufactured by FUJIFILM Wako Pure Chemical Corporation, Wako 1st Grade), ammonia water (manufactured by Kishida Chemical Co., Ltd., special grade reagent), PL-3 (manufactured by FUSO CHEMICAL CO., LTD.) and ion exchanged water were stirred and mixed to obtain a concentrate, and then the concentrate was diluted by 40 times with ion exchanged water immediately before use. The following is the composition of the polishing liquid composition used in the final polishing.

Silica particles (PL-3): 0.17 mass %
HEC (SE-400): 0.01 mass %
Ammonia: 0.01 mass %
PEG (weight average molecular weight: 6000): 0.0008 mass %

[Final Polishing Conditions]
Polishing machine: a single-sided 8-inches polishing machine "GRIND-X SPP600s" (manufactured by Okamoto Machine Tool Works, Ltd.)
Polishing pad: suede pad (manufactured by Toray Coatex Co., Ltd., ASKER hardness: 64, thickness: 1.37 mm, nap length: 450 μm, opening diameter: 60 μm)
Silicon wafer polishing pressure: 100 g/cm$^2$
Number of rotary table revolutions: 60 rpm
Polishing time: 5 minutes
Polishing liquid composition supply rate: 150 g/min
Temperature of polishing liquid composition: 23° C.
Carrier rotation rate: 60 rpm

[Rinsing Conditions]
Polishing machine: a single-sided 8-inches polishing machine "GRIND-X SPP600s" (manufactured by Okamoto Machine Tool Works, Ltd.)
Polishing pad: suede pad (manufactured by Toray Coatex Co., Ltd., ASKER hardness: 64, thickness: 1.37 mm, nap length: 450 μm, opening diameter: 60 μm)
Silicon wafer rinsing pressure: 60 g/cm$^2$
Number of rotary table revolutions: 30 rpm
Rinsing time: 10 seconds
Rinsing composition supply rate: 1000 mL/min
Temperature of rinsing composition: 23° C.
Carrier rotation rate: 30 rpm 4. Washing Method After the rinsing treatment, the silicon wafer was subjected to washing with ozone and washing with dilute hydrofluoric acid as described below. In the washing with ozone, an aqueous solution containing 20 ppm of ozone was jetted at a flow rate of 1 L/min. for 3 minutes from a nozzle toward the center of a silicon wafer rotating at 600 rpm. At this time, the temperature of the ozone water was set to a room temperature. Next, washing with dilute hydrofluoric acid was carried out. In the washing with dilute hydrofluoric acid, an aqueous solution containing 0.5 mass % of ammonium hydrogen fluoride (special grade: Nakalai Tesque, Inc.) was jetted at a flow rate of 1 L/min for 5 seconds from a nozzle toward the center of the silicon wafer rotating at 600 rpm. The set of one washing with ozone and one washing with dilute hydrofluoric acid was carried out twice, which was followed by a final spin drying. In the spin drying, the silicon wafer was rotated at 1500 rpm.

5. Evaluation of Surface Defects (LPD) of Silicon Wafer

The LPD of the silicon wafer surfaces after washing was evaluated by measuring the number of particles having a particle diameter of 45 nm or more on the silicon wafer surfaces using a surface roughness measuring device "Surfscan SP1-DLS" (manufactured by KLA Corporation). The evaluation results of the LPD indicates that the smaller the value, the less the surface defects. Two silicon wafers were used for each LPD measurement. Table 2 indicates the average values.

TABLE 2

| | | | Water-soluble polymer and comparison object | | | | |
|---|---|---|---|---|---|---|---|
| | | | | Constitutional unit A | Constitutional unit B | Polymer structure | Concentration (mass %) | LPD (number) |
| Example | 1 | A1 | SBMA | — | Betaine | 0.05 | 148 |
| | 2 | A2 | SBMA | BMA | Betaine/Hydrophobic group | 0.05 | 87 |
| | 3 | A3 | SBMA | MOEDES | Betaine/Cation | 0.05 | 105 |
| | 4 | A4 | MPC | BMA | Betaine/ | 0.05 | 56 |
| | 5 | A5 | MPC | BMA | Hydrophobic group | 0.05 | 58 |
| | 6 | A6 | MPC | LMA | | 0.05 | 49 |
| | 7 | A7 | MPC | THMPA | Betaine/Cation | 0.001 | 142 |
| | 8 | | | | | 0.01 | 59 |
| | 9 | | | | | 0.05 | 44 |
| | 10 | | | | | 0.1 | 49 |
| | 11 | | | | | 0.5 | 81 |
| | 12 | | | | | 1.0 | 120 |
| | 13 | | | | | 0.05 | 53 |
| | 14 | | | | | 0.05 | 45 |
| | 15 | A8 | CBMA | | Betaine | 0.05 | 108 |
| | 16 | A9 | CBMA | MOETMA/MPEGMA | Betaine/Cation/EO (nonion) | 0.05 | 49 |
| | 17 | A10 | CBMA | MOETMA/HEMA | Betaine/Cation/Hydroxyl group (nonion) | 0.05 | 71 |
| Comparative Example | 1 | A51 | | pNIPAM | — | 0.018 | 253 |
| | 2 | A52 | | HEC | — | 0.0125 | 229 |
| | 3 | A53 | | PVA | — | 0.0125 | 246 |
| | 4 | A54 | | PEG | — | 0.0125 | 4520 |
| | 5 | A52 + A55 | | HEC (Mw 250,000) + POE(5) decyl ether | — | 0.01 + 0.00013 | 191 |
| | 6 | A56 | | 2-(Trimethylammonio)acetate | — | 0.1 | 2574 |
| | 7 | A57 | | PAM/PAA | — | 0.05 | 2215 |
| | 8 | A58 | | CBMA monomer | — | 0.05 | 3168 |

As shown in Table 2, the rinsing compositions of Examples 1-17 significantly reduced the number of the LPD as compared with the rinsing compositions of Comparative Examples 1-8.

INDUSTRIAL APPLICABILITY

The rinsing composition of the present invention can reduce the number of the LED while shortening the washing time of silicon wafers, thereby contributing to the improvement in the productivity and cost reduction and being useful in the production of semiconductor substrates.

The invention claimed is:

1. A rinsing composition for a silicon wafer, comprising:
a water-soluble polymer A containing a constitutional unit A having a betaine structure; and
an aqueous medium.

2. The rinsing composition for a silicon wafer according to claim 1, wherein the constitutional unit A having a betaine structure in the water-soluble polymer A comprises a constitutional unit expressed by Formula (1) below:

[Chemical formula 1]

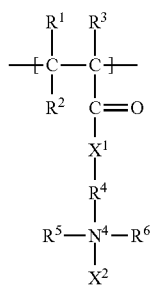

(1)

where
$R^1$ to $R^3$ are the same or different and represent a hydrogen atom, a methyl group or an ethyl group,
$R^4$ is an alkylene group with 1 to 4 carbon atoms or $-Y^1\text{-OPO}_3^- -Y^2-$,
$Y^1$ and $Y^2$ are the same or different and represent an alkylene group with 1 to 4 carbon atoms,
$R^5$ and $R^6$ are the same or different and represent a hydrocarbon group with 1 to 4 carbon atoms,
$X^1$ is O or $NR^7$,
$R^7$ is a hydrogen atom or a hydrocarbon group with 1 to 4 carbon atoms,
$X^2$ is a hydrocarbon group with 1 to 4 carbon atoms, $-R^{17}SO_3^-$ or $-R^{18}COO^-$,
$R^{17}$ and $R^{18}$ are the same or different and represent an alkylene group with 1 to 4 carbon atoms, and
when $R^4$ is an alkylene group with 1 to 4 carbon atom, $X^2$ is $-R^{17}SO_3^-$ or $-R^{18}COO^-$, and when $R^4$ is $-Y^1-\text{OPO}_3^- -Y^2-$, $X^2$ is a hydrocarbon group with 1 to 4 carbon atoms.

3. The rinsing composition for a silicon wafer according to claim 2, wherein the water-soluble polymer A further contains a constitutional unit B expressed by Formula (2) below:

[Chemical formula 2]

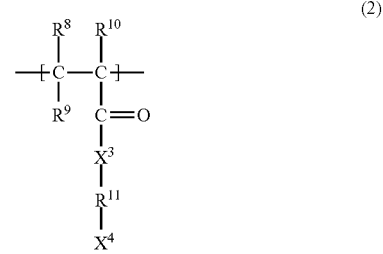

(2)

where
$R^8$ to $R^{10}$ are the same or different and represent a hydrogen atom, a methyl group or an ethyl group,
$X^3$ is O or $NR^{19}$,
$R^{19}$ is a hydrogen atom or a hydrocarbon group with 1 to 4 carbon atoms,
$R^{11}$ is an alkylene group with 1 to 22 carbon atoms (a hydrogen atom of the alkylene group may be substituted with a hydroxyl group) or $-(AO)_m-$ (where AO represents an alkyleneoxy group with 2 to 4 carbon atoms, and m represents an average number of added moles of 1 to 150),
$X^4$ is a hydrogen atom, a hydrocarbon group with 1 to 4 carbon atoms (a hydrogen atom of the hydrocarbon group may be substituted with a hydroxyl group), a hydroxyl group, $N^+R^{12}R^{13}R^{14}$ or $NR^{15}R^{16}$, and
$R^{12}$ to $R^{16}$ are the same or different and represent a hydrogen atom or a hydrocarbon group with 1 to 4 carbon atoms.

4. The rinsing composition for a silicon wafer according to claim 1, wherein a weight average molecular weight of the water-soluble polymer A is 1,000 or more and 3,000,000 or less.

5. A method for rinsing a silicon wafer, comprising a step of rinsing a polished silicon wafer using the rinsing composition for a silicon wafer according to claim 1.

6. A method for producing a semiconductor substrate, comprising a step of rinsing a polished silicon wafer using the rinsing composition for a silicon wafer according to claim 1.

* * * * *